United States Patent
Jin et al.

(10) Patent No.: US 10,950,641 B2
(45) Date of Patent: Mar. 16, 2021

(54) IMAGE SENSOR AND ELECTRONIC DEVICE INCLUDING THE SAME

(71) Applicant: Samsung Electronics Co., Ltd., Suwon-si (KR)

(72) Inventors: Yong Wan Jin, Seoul (KR); Gae Hwang Lee, Seongnam-si (KR); Seon-Jeong Lim, Yongin-si (KR); Sung Young Yun, Suwon-si (KR); Kwang Hee Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/026,224

(22) Filed: Jul. 3, 2018

(65) Prior Publication Data

US 2018/0331143 A1    Nov. 15, 2018

Related U.S. Application Data

(63) Continuation of application No. 15/202,996, filed on Jul. 6, 2016, now Pat. No. 10,043,840.

(30) Foreign Application Priority Data

Nov. 30, 2015 (KR) .................. 10-2015-0169035

(51) Int. Cl.
*H01L 27/146* (2006.01)
*H01L 27/30* (2006.01)
*H04N 1/00* (2006.01)

(52) U.S. Cl.
CPC .... *H01L 27/14621* (2013.01); *H01L 27/1461* (2013.01); *H01L 27/14601* (2013.01); *H01L 27/14634* (2013.01); *H01L 27/14643* (2013.01); *H01L 27/14647* (2013.01); *H01L 27/307* (2013.01); *H04N 1/00* (2013.01)

(58) Field of Classification Search
CPC ......... H01L 27/14621; H01L 27/14643; H01L 27/307; H01L 27/14647; H01L 51/424; H01L 27/14601; H01L 27/1461; H01L 27/14634

See application file for complete search history.

(56) References Cited

U.S. PATENT DOCUMENTS 8,035,708 B2   10/2011   Takizawa et al.
8,436,308 B2   5/2013   Choe et al.
(Continued)

FOREIGN PATENT DOCUMENTS

EP   2770550 A1   8/2014
KR   101530696 B1   6/2015

OTHER PUBLICATIONS

European Search Report dated Apr. 7, 2017 for corresponding European Patent Application No. 16199020.5.

*Primary Examiner* — Shouxiang Hu

(74) *Attorney, Agent, or Firm* — Harness, Dickey & Pierce, P.L.C.

(57) ABSTRACT

An image sensor includes a semiconductor substrate including a plurality of photo-sensing devices, a photoelectric conversion device disposed on the semiconductor substrate and absorbing the mixed light of a first color and a second color, and a color filter disposed on one side of the photoelectric conversion device and configured to selectively transmit a mixed light including a third color, and an electronic device including the image sensor is provided.

10 Claims, 8 Drawing Sheets

(56) References Cited

U.S. PATENT DOCUMENTS

| | | |
|---|---|---|
| 2003/0128409 A1 | 7/2003 | Vook et al. |
| 2005/0205879 A1 | 9/2005 | Fukunaga |
| 2007/0012955 A1 | 1/2007 | Lhama |
| 2007/0279501 A1 | 12/2007 | Goto et al. |
| 2008/0179641 A1 | 7/2008 | Asaba |
| 2010/0117126 A1 | 5/2010 | Takahashi |
| 2010/0123070 A1* | 5/2010 | Natori ............... H01L 27/14647 250/226 |
| 2012/0193689 A1* | 8/2012 | Park ................... H01L 27/307 257/290 |
| 2013/0182173 A1 | 7/2013 | Murata |
| 2014/0001454 A1 | 1/2014 | Miyanami et al. |
| 2014/0239278 A1 | 8/2014 | Park et al. |
| 2014/0264298 A1 | 9/2014 | Park |
| 2015/0187844 A1 | 7/2015 | Lee et al. |
| 2015/0188064 A1 | 7/2015 | Kim et al. |
| 2015/0372036 A1* | 12/2015 | Suh ................... H01L 27/1462 348/273 |

* cited by examiner

[FIG. 1]
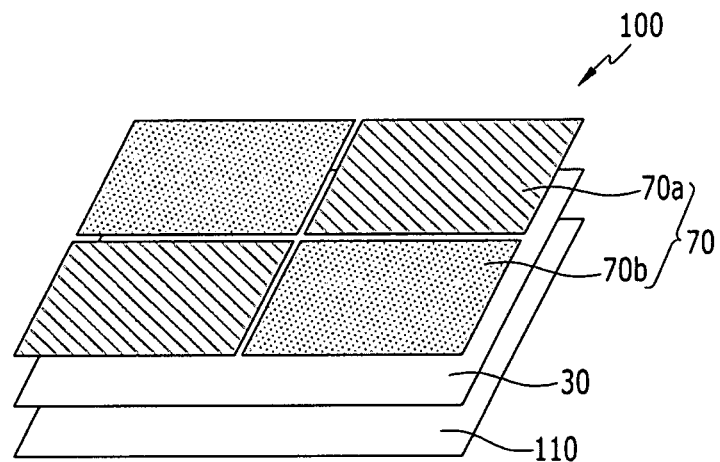
[FIG. 2]
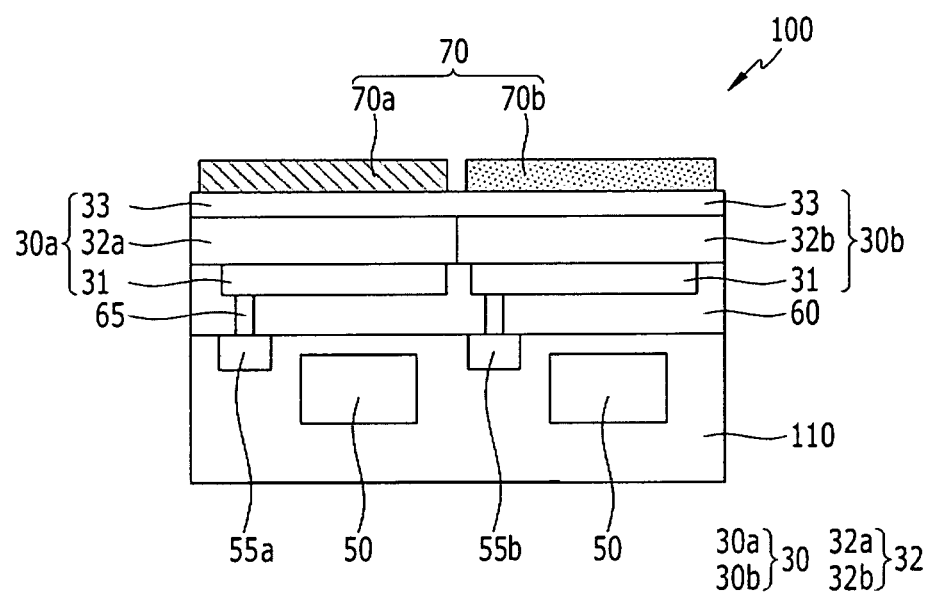

[FIG. 3]
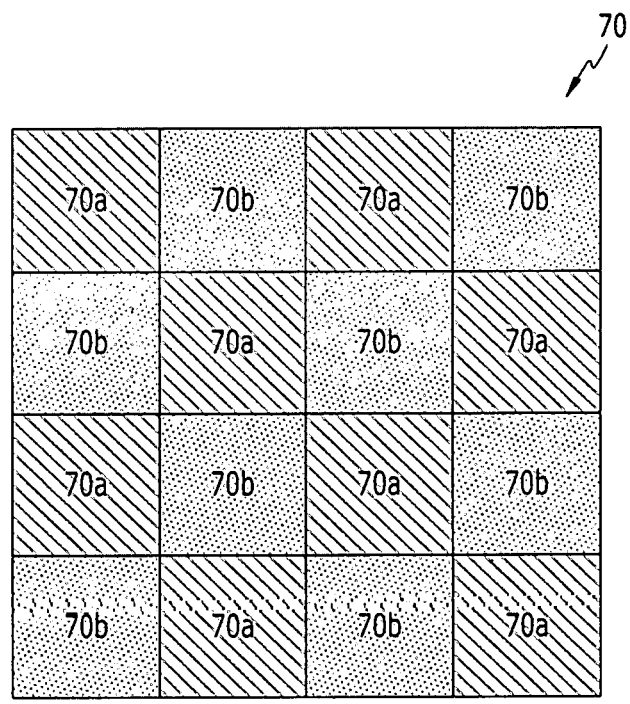
[FIG. 4]
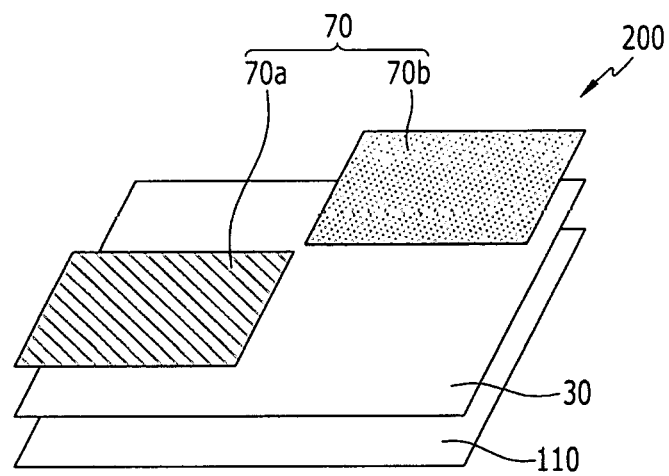

[FIG. 5]
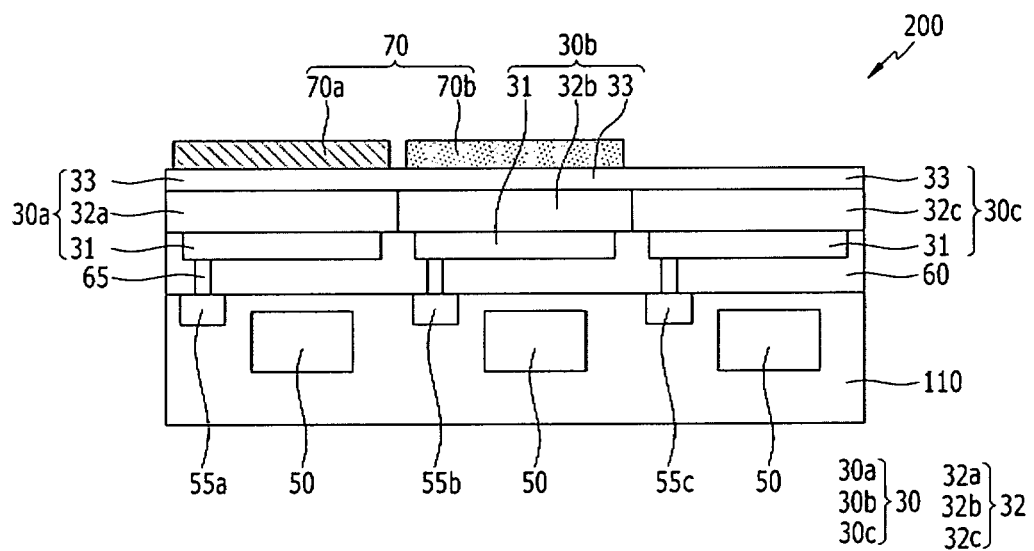
[FIG. 6]
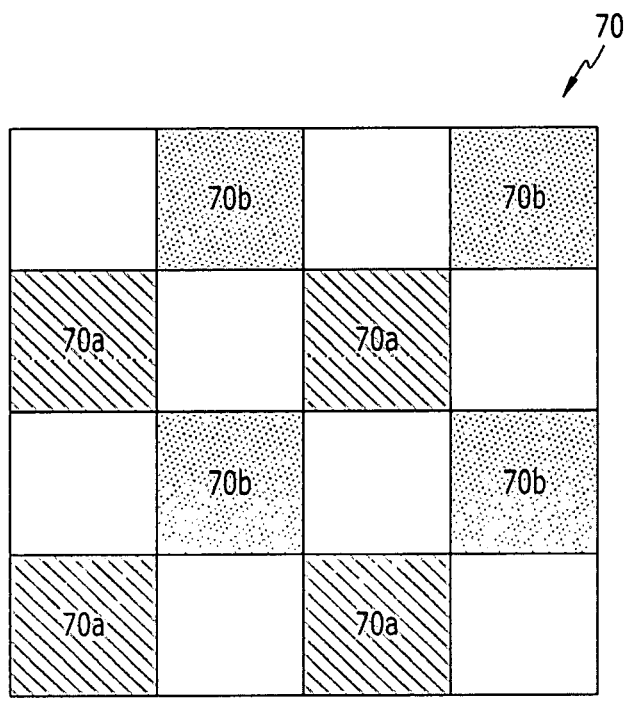

[FIG. 7]
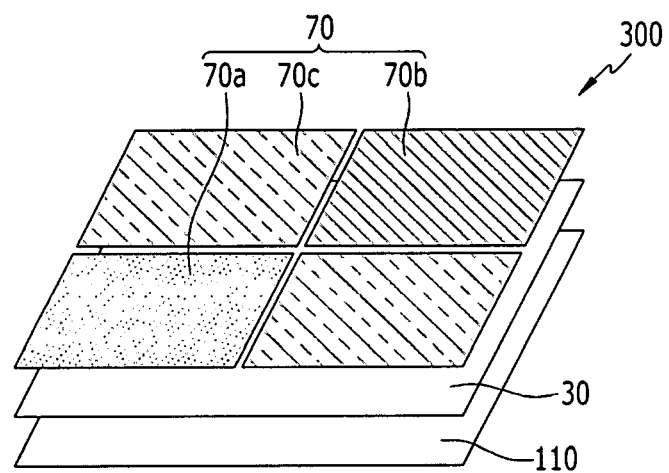
[FIG. 8]
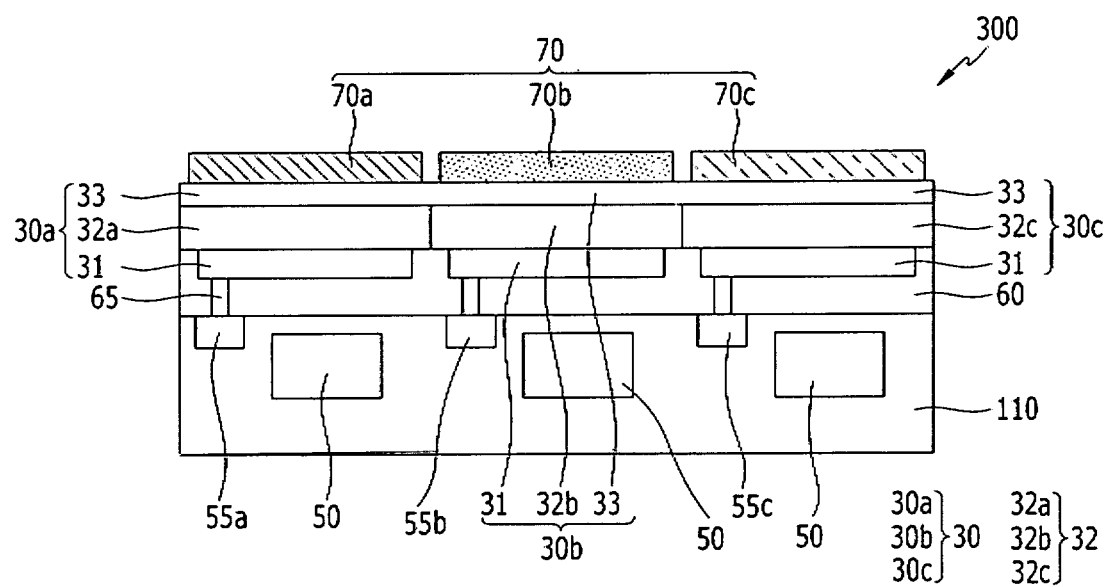

[FIG. 9]
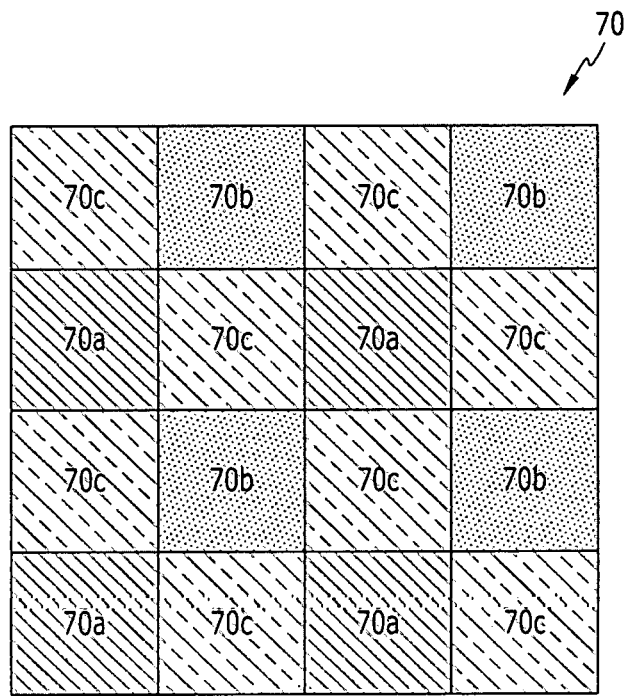
[FIG. 10]
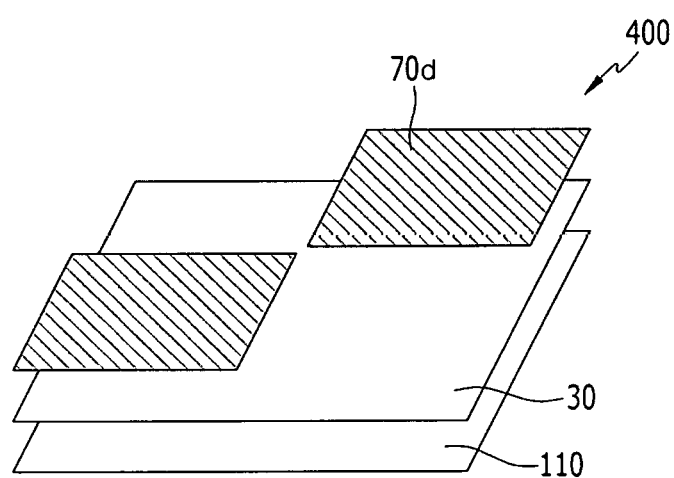

[FIG. 11]
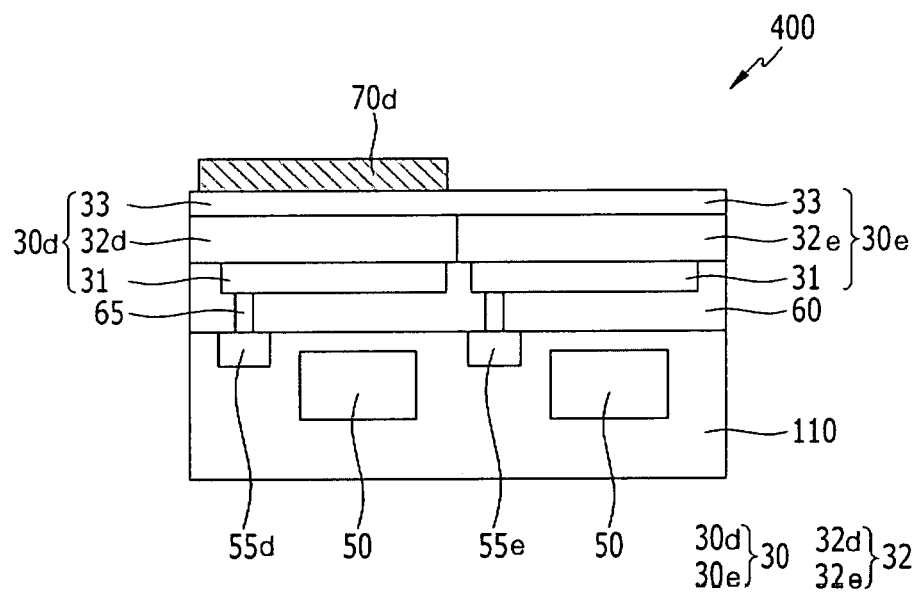
[FIG. 12]
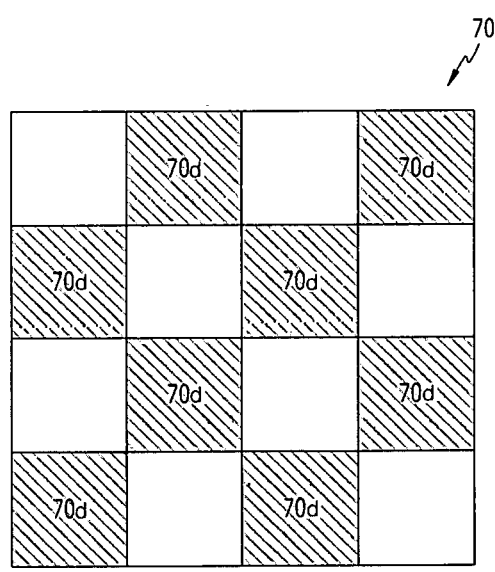

[FIG. 13]
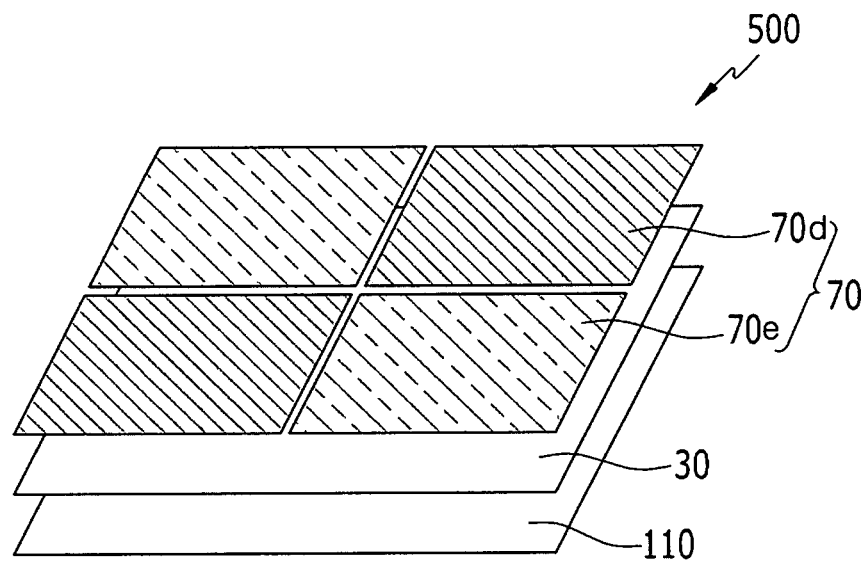
[FIG. 14]
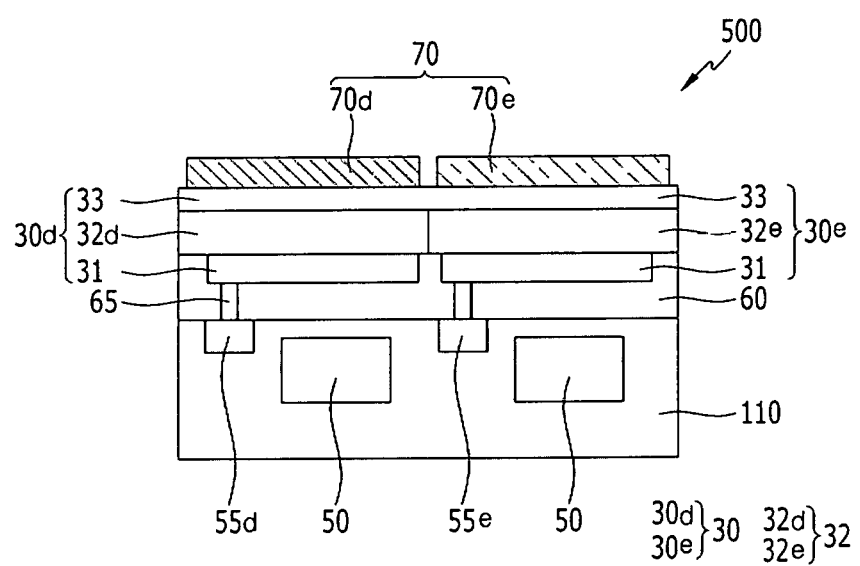

[FIG. 15]
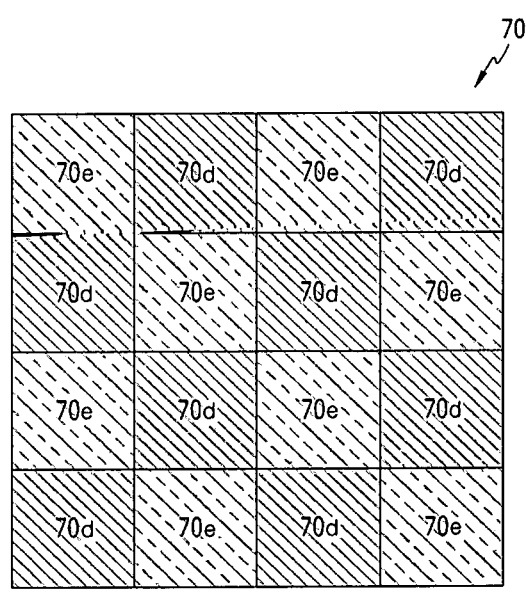

IMAGE SENSOR AND ELECTRONIC DEVICE INCLUDING THE SAME

RELATED APPLICATIONS

This is a continuation application of U.S. application Ser. No. 15/202,996, filed on Jul. 6, 2016, which claims priority to Korean Patent Application No. 10-2015-0169035 filed in the Korean Intellectual Property Office on Nov. 30, 2015, the entire contents of each of which are incorporated herein by reference.

BACKGROUND

1. Field

Example embodiments relate to an image sensor and/or an electronic device including the same.

2. Description of the Related Art

An imaging device is typically used in digital cameras and camcorders, etc., to capture an image and to store the image as an electrical signal, and the imaging device includes an image sensor separating incident light according to wavelength and converting each or one or more component of the separated incident light to an electrical signal.

There has been an ongoing demand for reduction in the size of image sensors. In order to reduce the image sensor size, image sensors having a stacking structure have been researched.

SUMMARY

One example embodiment relates to an image sensor having a novel structure capable of improving sensitivity by increasing wavelength selectivity.

Another example embodiment relates to an electronic device including the image sensor.

According to one example embodiment, an image sensor includes a semiconductor substrate including a plurality of photo-sensing devices, a photoelectric conversion device disposed on the semiconductor substrate and absorbing mixed light of a first color and a second color, and a color filter disposed on one side of the photoelectric conversion device and configured to selectively transmit a mixed light including a third color.

The color filter may include at least one of a first color filter configured to selectively transmit mixed light of a first color and of a third color, and a second color filter configured to selectively transmit mixed light of a second color and of the third color.

The color filter may include the first color filter and the second color filter.

The first color filter and the second color filter may be alternately arranged along a row and a column.

The photoelectric conversion device may include a first photoelectric conversion device overlapping the first color filter and configured to convert light of a first color, and a second photoelectric conversion device overlapping the second color filter and configured to convert light of a second color.

The photoelectric conversion device may include a first photoelectric conversion device overlapping the first color filter and configured to convert light of a first color, a second photoelectric conversion device overlapping the second color filter and configured to convert light of a second color, and a third photoelectric conversion device not overlapping the first color filter or the second color filter and configured to convert mixed light of the first color and the second color.

The color filter may further include a third color filter configured to transmit mixed light of the first color, the second color, and the third color, and the third color filter may be arranged to be adjacent to the first color filter or the second color filter.

In example embodiments, the photoelectric conversion device may include a first photoelectric conversion device overlapping the first color filter and configured to convert light of a first color, a second photoelectric conversion device overlapping the second color filter and configured to convert light of a second color, and a third photoelectric conversion device overlapping the third color filter and configured to convert mixed light of the first color and the second color.

The color filter may include the first color filter or the second color filter.

The first color filter or the second color filter may be arranged to be spaced apart from each other along a row and a column.

The photoelectric conversion device may include a fourth photoelectric conversion device overlapping the first color filter or the second color filter and configured to convert light of a first color or of a second color, and a fifth photoelectric conversion device not overlapping the first color filter or the second color filter and configured to convert mixed light of the first color and of the second color.

The color filter may further include a third color filter configured to transmit mixed light of the first color, the second color, and the third color, and the first color filter or the second color filter and the third color filter may be alternately arranged along a row and a column.

The photoelectric conversion device may include a fourth photoelectric conversion device overlapping the first color filter or the second color filter and configured to convert light of a first color or of a second color, and a fifth photoelectric conversion device not overlapping the first color filter or the second color filter and configured to convert mixed light of the first color and of the second color.

The photo-sensing device may sense light of a third color.

The first color may be blue, the second color may be red, and the third color may be green.

In example embodiments, the photoelectric conversion device may include a pair of electrodes facing each other, and a light-absorption layer between the pair of electrodes and including a light-absorbing material selectively absorbing light of a first color, and a light-absorbing material selectively absorbing light of a second color, or a light-absorbing material selectively absorbing light of a first color and a second color.

According to another example embodiment, an image sensor includes a photoelectric conversion device configured to absorb mixed light of a first color and a second color and a photo-sensing device disposed on one side of the photoelectric conversion device and configured to sense a third color, wherein the photoelectric conversion device includes at least two of a first photoelectric conversion device configured to convert light of a first color, a second photoelectric conversion device configured to convert light of a second color, and a third photoelectric conversion device configured to convert mixed light of the first color and the second color.

The image sensor may further include a color filter positioned on the other side of the photoelectric conversion device, wherein the color filter includes at least one of a first color filter overlapping the first photoelectric conversion device and configured to selectively transmit mixed light of a first color and a third color, and a second color filter overlapping the second photoelectric conversion device and configured to selectively transmit mixed light of a second color and a third color.

The color filter may further include a third color filter overlapping the third photoelectric conversion device and configured to transmit mixed light of the first color, the second color, and of the third color.

According to another example embodiment, an electronic device including the image sensor is provided.

BRIEF DESCRIPTION OF THE DRAWINGS

FIG. 1 is a schematic view illustrating a stacking structure of an image sensor, according to one example embodiment, FIG. 2 is a cross-sectional view of the image sensor of FIG. 1, FIG. 3 is a schematic view illustrating arrangement of color filters of the image sensor of FIG. 1, FIG. 4 is a schematic view illustrating a stacking structure of an image sensor, according to another example embodiment, FIG. 5 is a cross-sectional view of the image sensor of FIG. 4, FIG. 6 is a schematic view illustrating an arrangement of color filters of the image sensor of FIG. 4, FIG. 7 is a schematic view illustrating a stacking structure of an image sensor, according to another example embodiment, FIG. 8 is a cross-sectional view of the image sensor of FIG. 7, FIG. 9 is a schematic view illustrating an arrangement of color filters of the image sensor of FIG. 7, FIG. 10 is a schematic view illustrating a stacking structure of an image sensor, according to another example embodiment, FIG. 11 is a cross-sectional view of the image sensor of FIG. 10, FIG. 12 is a schematic view illustrating an arrangement of color filters of the image sensor of FIG. 10, FIG. 13 is a schematic view illustrating a stacking structure of an image sensor, according to another example embodiment, FIG. 14 is a cross-sectional view of the image sensor of FIG. 13, and FIG. 15 is a schematic view illustrating an arrangement of color filters of the image sensor of FIG. 13.

DETAILED DESCRIPTION

Example embodiments will hereinafter be described in detail, and may be easily performed by those who have common knowledge in the related art. However, the example embodiments may be embodied in many different forms and are not to be construed as limited to the examples set forth herein.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawings, the thickness of layers, films, panels, regions, etc., are exaggerated for clarity. Like reference numerals designate like elements throughout the specification. The same reference numbers indicate the same components throughout the specification.

In the drawings, parts having no relationship with the description are omitted for clarity of the embodiments, and the same or similar constituent elements are indicated by the same reference numerals throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list. As used herein, 'a combination thereof' refers to a mixture and a stacking structure of two or more.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Hereinafter, an image sensor according to one example embodiment is described with reference to drawings. As an example of an image sensor, an organic CMOS image sensor is described.

FIG. 1 is a schematic view illustrating a stacking structure of an image sensor according to an example embodiment, FIG. 2 is a cross-sectional view of the image sensor of FIG. 1, and FIG. 3 is a schematic view illustrating an arrangement of color filters of the image sensor of FIG. 1.

An image sensor 100 according to an example embodiment includes a color filter layer 70, a photoelectric conversion device 30, and a semiconductor substrate 110.

The color filter layer 70 includes an array of a plurality of unit color filters that are repeatedly arranged along a row and a column, and each, or one or more, unit color filter array may have various matrix arrangements, for example 2×2, 3×3, 4×4, and the like.

The color filter layer 70 may include a color filter configured to transmit mixed light of two colors selected from three primary colors of a first color, a second color and a third color.

The color filter layer 70 may include a first color filter 70a configured to selectively transmit mixed light of a first color and a third color, and a second color filter 70b configured to selectively transmit mixed light of a second color and a third color, and the first color filter 70a and the second color filter 70b may be alternately arranged along a row and a column.

For example, the first color filter 70a and the second color filter 70b may be respectively a cyan filter configured to transmit mixed light of blue and green, a yellow filter configured to transmit mixed light of red and green, or a magenta filter configured to transmit mixed light of blue and red.

The first color filter 70a and the second color filter 70b may transmit light of a third color in common, and for example when the first color filter 70a is a cyan filter, the second color filter 70b is a yellow filter, the first color filter 70a and the second color filter 70b may both transmit green light.

The photoelectric conversion device 30 may be disposed under the color filter layer 70, and may selectively sense at least one part of light transmitting the color filter layer 70.

The photoelectric conversion device 30 includes a lower electrode 31 and an upper electrode 33 facing each other, and a light-absorption layer 32 between the lower electrode 31 and the upper electrode 33.

One of the lower electrode 31 and the upper electrode 33 is an anode and the other is a cathode. At least one of the lower electrode 31 and the upper electrode 33 may be a light-transmitting electrode, and the light-transmitting electrode may be made of or include, for example, a transparent conductor such as indium tin oxide (ITO) or indium zinc oxide (IZO), or may be a metal thin layer having a thickness of several nanometers or several tens of nanometers, or a metal thin layer having a thickness of several nanometers to several tens of nanometers and being doped with a metal oxide.

The light-absorption layer 32 may selectively absorb a mixed light of a first color and a second color selected from three primary colors of a first color, a second color, and a third color. That is, the light-absorption layer 32 selectively absorbs mixed light of a first color and a second color, and transmits light of a third color.

The light-absorption layer 32 may include a p-type semiconductor and an n-type semiconductor, and at least one of the p-type semiconductor and the n-type semiconductor may be a light-absorbing material selectively absorbing mixed light of a first color and a second color. At least one of the p-type semiconductor and the n-type semiconductor may be, for example, a mixture of a light-absorbing material selectively absorbing light of a first color and a light-absorbing material selectively absorbing light of a second color, or a light-absorbing material selectively absorbing light of a first color and a second color. The light-absorbing material may be, for example an organic material, an inorganic material, or an organic/inorganic material. For example, the light-absorbing material selectively absorbing red light may be or include metal phthalocyanine, metal oxide phthalocyanine or a derivative thereof, for example copper phthalocyanine, zinc phthalocyanine, titanyl phthalocyanine, or a derivative thereof, but is not limited thereto. For example, a light-absorbing material selectively absorbing blue light may be or include fullerene or a fullerene derivative, but is not limited thereto. For example, a light-absorbing material selectively absorbing green light may be or include quinacridone or a derivative thereof, sub-phthalocyanine or a derivative thereof, thiophene or a derivative thereof, polythiophene or a derivative thereof or a compound represented by Chemical Formula 1, but is not limited thereto.

The light-absorption layer 32 may be a single layer or a multilayer. The light-absorption layer 32 may be, for example an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a volume ratio of about 1:100 to about 100:1. The p-type semiconductor and the n-type semiconductor may be mixed in a volume ratio of about 1:50 to about 50:1, about 1:10 to about 10:1, or about 1:1. When the p-type and n-type semiconductors have a composition ratio within one of the above ranges, an exciton may be effectively produced and a pn junction may be effectively formed.

The p-type layer may include the p-type semiconductor, and the n-type layer may include the n-type semiconductor.

The light-absorption layer 32 may have a thickness of about 1 nm to about 500 nm for example, about 5 nm to about 300 nm or about 5 nm to about 200 nm. Within the thickness range, the light-absorption layer 32 may effectively absorb the third visible light, effectively separate holes from electrons, and deliver the holes, thereby improving photoelectric conversion efficiency.

The light-absorption layer 32 overlaps the first color filter 70a and the second color filter 70b, and includes a first light-absorption region 32a overlapping the first color filter 70a and a second light-absorption region 32b overlapping the second color filter 70b.

In various example embodiments, mixed light of the first color and the third color transmitting through the first color filter 70a flows into the first light-absorption region 32a, light of the first color is selectively absorbed, and light of the third color is transmitted. Mixed light of the second color and the third color transmitting the second color filter 70b flows into the second light-absorption region 32b, light of the second color is selectively absorbed, and light of the third color is transmitted.

The lower electrode 31, the first light-absorption region 32a, and the upper electrode 33 form a first photoelectric conversion device 30a. Excitons may be generated from light of a first color absorbed in the first light-absorption region 32a, the generated excitons are separated into holes and electrons, the separated holes are transported to an anode that is one of the lower electrode 31 and the upper electrode 33, separated electrons are transported to a cathode that is one of the lower electrode 31 and the upper electrode 33, and electrons and/or holes are collected in the charge storage 55a to incur photoelectric conversion effects. The first photoelectric conversion device 30a detects a light signal of the first color.

The lower electrode 31, the second light-absorption region 32b, and the upper electrode 33 form a second photoelectric conversion device 30b. Excitons may be generated from light of a second color absorbed in the second light-absorption region 32b, the generated excitons are separated into holes and electrons, the separated holes are transported to an anode that is one of the lower electrode 31 and the upper electrode 33, separated electrons are transported to a cathode that is one of the lower electrode 31 and the upper electrode 33, and electrons and/or holes are collected in the charge storage 55b to incur photoelectric conversion effects. The second photoelectric conversion device 30b detects a light signal of the second color.

The semiconductor substrate 110 may be a silicon substrate, and is integrated with the photo-sensing device 50, the charge storages 55a and 55b and a transmission transistor (not shown).

The photo-sensing device 50 may be a photodiode. The photo-sensing device 50 senses light, and information related to the sensed light may be transferred by the transmission transistor. The charge storage 55a is electrically connected to the first photoelectric conversion device 30a, and information of the charge storage 55a may be transferred by the transmission transistor. The charge storage 55b is electrically connected to the second photoelectric conversion device 30b, and information collected via the charge storage 55b may be transferred by the transmission transistor.

The photo-sensing device 50 may sense light transmitting through the first color filter 70a and the first photoelectric conversion device 30a, or light transmitting through the second color filter 70b and the second photoelectric conversion device 30b. That is, the photo-sensing device 50 may sense light of the third color.

Specifically, mixed light of the first color and the third color of visible light including the first color, the second color, and the third color transmits through the first color filter 70a, and light of the first color is selectively absorbed by the first light-absorption region 32a, and thus the photo-sensing device 50 senses light of the third color. Likewise, mixed light of a second color and a third color of the visible light including the first color, the second color, and the third color transmits through the second color filter 70b, and light of the second color is selectively absorbed by the second light-absorption region 32b, and thus the photo-sensing device 50 senses light of the third color.

For example, the first color may be blue, the second color may be red, and the third color may be green. In this case, when the first color filter 70a is a cyan filter, the second color filter 70b is a yellow filter, and the light-absorption layer 32 absorbs mixed light of red and blue, the photo-sensing device 50 may sense green light.

For example, the first color may be red, the second color may be green, and the third color may be blue. In this case, when the first color filter 70a is a magenta filter, the second color filter 70b is a cyan filter, and the light-absorption layer 32 absorbs mixed light of red and green, the photo-sensing device 50 may sense blue light.

For example, the first color may be green, the second color may be blue, and the third color may be red. In this case, when the first color filter 70a is a yellow filter, the second color filter 70b is a magenta filter, and the light-absorption layer 32 absorbs mixed light of green and blue, the photo-sensing device 50 may sense red light.

A metal wire (not shown) and a pad (not shown) may be formed on the photo-sensing device 50. In order to decrease signal delay, the metal wire and pad may be made of or include a metal having low resistivity, for example, aluminum (Al), copper (Cu), silver (Ag), and alloys thereof, but are not limited thereto. Further, it is not limited to the structure, and the metal wire and pad may be positioned under the photo-sensing device 50.

According to at least one example embodiment, an insulation layer 60 is formed between the semiconductor substrate 110 and the photoelectric conversion device 30. The insulation layer 60 may be made of or include an inorganic insulating material such as, for example, silicon oxide and/or silicon nitride, or a low dielectric constant (low K) material such as SiC, SiCOH, SiCO, and SiOF. The insulation layer 60 has a trench 65 exposing the charge storages 55a and 55b. The trench 65 may be filled with fillers.

A focusing lens (not shown) may be further formed on the color filter layer 70. The focusing lens may control a direction of the incident light and gather the light in one region. The focusing lens may have the shape of, for example, a cylinder or a hemisphere, but is not limited thereto.

The image sensor according to an example embodiment has a structure where the photoelectric conversion device 30 is stacked on the semiconductor substrate 110, and thus an area of the image sensor may be reduced and a down-sized image sensor may be realized.

The image sensor according to an example embodiment may reduce light loss by a color filter and thus increase light-absorption efficiency by including a color filter configured to transmit mixed light.

In addition, the image sensor according to an example embodiment has increased wavelength selectivity of light absorbed by a photoelectric conversion device and light sensed by a photo-sensing device, and thus reduces crosstalk.

The image sensor according to an example embodiment decreases a gap between the photoelectric conversion device and the semiconductor substrate by disposing a color filter layer at the upper side, and processability is improved and current loss is decreased as a result.

Hereinafter, an image sensor according to another example embodiment is described.

FIG. 4 is a schematic view illustrating a stacking structure of an image sensor according to another example embodiment, FIG. 5 is a cross-sectional view of the image sensor of FIG. 4, and FIG. 6 is a schematic view illustrating an arrangement of color filters of the image sensor of FIG. 4.

The image sensor 200 according to an example embodiment includes a color filter layer 70, a photoelectric conversion device 30, and a semiconductor substrate 110.

The color filter layer 70 includes an array of a plurality of unit color filters that are repeatedly arranged along a row and a column, and the unit color filter array may have various matrix arrangements, for example 2×2, 3×3, 4×4, and the like.

The color filter layer 70 may include a color filter configured to transmit mixed light of two colors selected from three primary colors of a first color, a second color and a third color. The color filter layer 70 may include a first color filter 70a configured to selectively transmit mixed light of a first color and a third color, and a second color filter configured to selectively transmit mixed light of a second color and a third color 70b.

However, the image sensor 200 according to an example embodiment includes a region without a color filter in a matrix arrangement of the unit color filter array. That is, the unit color filter array includes a first color filter 70a configured to selectively transmit mixed light of a first color and a third color, and a second color filter 70b configured to selectively transmit mixed light of a second color and a third color, and the first color filter 70a and the second color filter 70b may be arranged to be spaced apart from each other along a row and a column.

The first color filter 70a and the second color filter 70b may both transmit light of a third color, and for example when the first color filter 70a is a cyan filter, the second color filter 70b is a yellow filter, the first color filter 70a and the second color filter 70b may both transmit green light.

The photoelectric conversion device 30 may be disposed under the color filter layer 70, and may selectively sense at least a portion of the light transmitting through the color filter layer 70.

The photoelectric conversion device 30 includes a lower electrode 31 and a upper electrode 33 facing each other, and a light-absorption layer 32 between the lower electrode 31 and the upper electrode 33.

The light-absorption layer 32 may selectively absorb mixed light of a first color and a second color selected from three primary colors of a first color, a second color, and a third color. That is, the light-absorption layer 32 selectively absorbs mixed light of a first color and a second color, and transmits light of a third color.

The light-absorption layer 32 includes a first light-absorption region 32a overlapping the first color filter 70a, a second light-absorption region 32b overlapping the second color filter 70b, and a third light-absorption region 32c not overlapping the first color filter 70a or the second color filter 70b.

Mixed light of the first color and the third color transmitting through the first color filter 70a flows into the first light-absorption region 32a, and light of the first color is selectively absorbed and light of the third color is transmitted. Mixed light of the second color and the third color transmitting through the second color filter 70b flows into the second light-absorption region 32b, and light of the second color is selectively absorbed and light of the third color is transmitted. Incident light flows into the third light-absorption region 32c, and mixed light of the first color and the second color is selectively absorbed and light of the third color is transmitted.

The lower electrode 31, the first light-absorption region 32a, and the upper electrode 33 form a first photoelectric conversion device 30a. Excitons may be generated from light of a first color absorbed in the first light-absorption region 32a, the generated excitons are separated into holes and electrons, the separated holes are transported to an anode that is one of the lower electrode 31 and the upper electrode 33, the separated electrons are transported to a cathode that is one of the lower electrode 31 and the upper electrode 33, and the electrons and/or holes are collected in the charge storage 55a to incur photoelectric conversion effects. The first photoelectric conversion device 30a detects a signal of light of the first color.

The lower electrode 31, the second light-absorption region 32b, and the upper electrode 33 form a second photoelectric conversion device 30b. Excitons may be generated from light of a second color absorbed in the second light-absorption region 32b, the generated excitons are separated into holes and electrons, the separated holes are transported to an anode that is one of the lower electrode 31 and the upper electrode 33, the separated electrons are transported to a cathode that is one of the lower electrode 31 and the upper electrode 33, and the electrons and/or holes are collected in the charge storage 55b to incur photoelectric conversion effects. The second photoelectric conversion device 30b obtains a signal of light of the second color.

The lower electrode 31, the third light-absorption region 32c, and the upper electrode 33 form a third photoelectric conversion device 30c. Excitons may be generated from mixed light of a first color and a second color absorbed in the third light-absorption region 32c, the generated excitons are separated into holes and electrons, the separated holes are transported to an anode that is one of the lower electrode 31 and the upper electrode 33, the separated electrons are transported to a cathode that is one of the lower electrode 31 and the upper electrode 33, and electrons and/or holes are collected in the charge storage 55c to incur photoelectric conversion effects. The third photoelectric conversion device 30c obtains a signal of light of the first color and the second color.

The semiconductor substrate 110 may be a silicon substrate, and is integrated with the photo-sensing device 50, the charge storages 55a, 55b, and 55c, and a transmission transistor (not shown).

The photo-sensing device 50 may be a photodiode. The photo-sensing device 50 senses light, and information derived from the sensed light may be transferred by the transmission transistor. The charge storage 55a is electrically connected to the first photoelectric conversion device 30a, and information from the charge storage 55a may be transferred by the transmission transistor. The charge storage 55b is electrically connected to the second photoelectric conversion device 30b, and information from the charge storage 55b may be transferred by the transmission transistor. The charge storage 55c is electrically connected to the third photoelectric conversion device 30c and information of the charge storage 55c may be transferred by the transmission transistor.

The photo-sensing device 50 may sense light transmitting through the first color filter 70a and the first photoelectric conversion device 30a, light transmitting through the second color filter 70b and the second photoelectric conversion device 30b, or light transmitting through the third photoelectric conversion device 30c. That is, the photo-sensing device 50 may sense light of the third color.

Specifically, mixed light of the first color and the third color of visible light including the first color, the second color, and the third color transmits the first color filter 70a, and light of the first color is selectively absorbed by the first light-absorption region 32a, and thus the photo-sensing device 50 senses light of the third color. Likewise, mixed light of a second color and a third color of the visible light including the first color, the second color, and the third color transmits the second color filter 70b, and light of the second color is selectively absorbed by the second light-absorption region 32b, and thus the photo-sensing device 50 senses light of the third color. Likewise, visible light including the first color, the second color, and the third color reaches the third photoelectric conversion device 30c, light of the first color or the second color is selectively absorbed by the third light-absorption region 32c, and thus the photo-sensing device 50 senses light of the third color.

A metal wire (not shown) and a pad (not shown) are formed on the photo-sensing device 50. Further, the metal wire and pad may be positioned under the photo-sensing device 50.

According to at least one example embodiment, an insulation layer 60 is formed between the semiconductor substrate 110 and the photoelectric conversion device 30. The insulation layer 60 has a trench 65 exposing the charge storages 55a, 55b, and 55c.

According to at least one example embodiment, the image sensor according has a structure where the photoelectric conversion device 30 is stacked on the semiconductor substrate 110, and thus an area of the image sensor may be reduced and a down-sized image sensor may be realized.

The image sensor according to the example embodiment may reduce light loss by a color filter, and may thus increase light-absorption efficiency by including a color filter configured to transmit mixed light. Furthermore, the image sensor according to the example embodiment includes a region without a color filter, and thereby reduces light loss by a color filter and increase light-absorption efficiency.

In addition, the image sensor according to the example embodiment has increased wavelength selectivity of light absorbed by a photoelectric conversion device and light sensed by a photo-sensing device, and thus reduces crosstalk.

The image sensor according to the example embodiment decreases a gap between the photoelectric conversion device and the semiconductor substrate by disposing a color filter layer at the upper side, and processability is improved and current loss is decreased as a result.

Hereinafter, an image sensor according to another example embodiment is described.

FIG. 7 is a schematic view illustrating a stacking structure of an image sensor according to another embodiment, FIG. 8 is a cross-sectional view of the image sensor of FIG. 7, and FIG. 9 is a schematic view illustrating an arrangement of color filters of the image sensor of FIG. 7.

An image sensor 300 according to the example embodiment includes a color filter layer 70, a photoelectric conversion device 30, and a semiconductor substrate 110.

The color filter layer 70 includes an array of a plurality of unit color filters that are repeatedly arranged along a row and a column, and the color filter array may have various matrix arrangements, for example 2×2, 3×3, 4×4, and the like.

The color filter layer 70 may include a color filter configured to transmit mixed light of two colors selected from three primary colors of a first color, a second color and a third color. The color filter layer 70 may include a first color filter 70a configured to selectively transmit mixed light of a first color and a third color, and a second color filter 70b configured to selectively transmit mixed light of a second color and a third color. The first color filter 70a and the second color filter 70b may be arranged to be apart from each other along a row and a column.

However, the image sensor according to the example embodiment 300 may further include a third color filter 70c configured to transmit mixed light of the first color, the second color, and the third color. The third color filter 70c may be, for example a white color filter. The third color filter 70c may be disposed to be adjacent to the first color filter 70a and/or the second color filter 70b, and the number of third color filters 70c may be the same as or larger than the number of first color filters 70a or second color filters 70b.

The first color filter 70a, the second color filter 70b, and the third color filter 70c may all transmit light of a third color, and for example when the first color filter 70a is a cyan filter, the second color filter 70b is a yellow filter, and the third color filter 70c is a white color filter, the first color filter 70a, the second color filter 70b, and the third color filter 70c may all transmit green light.

The photoelectric conversion device 30 may be disposed under the color filter layer 70 and may selectively sense at least a portion of light transmitting through the color filter layer 70.

The photoelectric conversion device 30 includes a lower electrode 31 and a upper electrode 33 facing each other, and a light-absorption layer 32 between the lower electrode 31 and the upper electrode 33.

The light-absorption layer 32 may selectively absorb mixed light of a first color and a second color selected from three primary colors of a first color, a second color, and a third color. That is, the light-absorption layer 32 selectively absorbs mixed light of a first color and a second color and transmits light of a third color.

The light-absorption layer 32 includes a first light-absorption region 32a overlapping the first color filter 70a, a second light-absorption region 32b overlapping the second color filter 70b, and a third light-absorption region 32c overlapping the third color filter 70c.

Mixed light of the first color and the third color transmitting through the first color filter 70a flows into the first light-absorption region 32a, light of the first color is selectively absorbed, and light of the third color is transmitted. Mixed light of the second color and the third color transmitting through the second color filter 70b flows into the second light-absorption region 32b, light of the second color is selectively absorbed, and light of the third color is transmitted. Mixed light of the first color, the second color, and the third color transmitting through the third color filter 70c flows into the third light-absorption region 32c, mixed light of the first color and the second color is selectively absorbed, and light of the third color is transmitted.

The lower electrode 31, the first light-absorption region 32a, and the upper electrode 33 form a first photoelectric conversion device 30a. Excitons may be generated from light of a first color absorbed in the first light-absorption region 32a, the generated excitons are separated into holes and electrons, the separated holes are transported to an anode that is one of the lower electrode 31 and the upper electrode 33, the separated electrons are transported to a cathode that is one of the lower electrode 31 and the upper electrode 33, and the electrons and/or holes are collected in the charge storage 55a to incur photoelectric conversion effects. The first photoelectric conversion device 30a obtains a signal of light of the first color.

The lower electrode 31, the second light-absorption region 32b, and the upper electrode 33 form a second photoelectric conversion device 30b. Excitons may be generated from light of a second color absorbed in the second light-absorption region 32b, the generated excitons are separated into holes and electrons, the separated holes are transported to an anode that is one of the lower electrode 31 and the upper electrode 33, the separated electrons are transported to a cathode that is one of the lower electrode 31 and the upper electrode 33, and the electrons and/or holes are collected in the charge storage 55b to incur photoelectric conversion effects. The second photoelectric conversion device 30b obtains a signal of light of the second color.

The lower electrode 31, the third light-absorption region 32c, and the upper electrode 33 form a third photoelectric conversion device 30c. Excitons may be generated from mixed light of a first color and a second color absorbed in the third light-absorption region 32c, the generated excitons are separated into holes and electrons, the separated holes are transported to an anode that is one of the lower electrode 31 and the upper electrode 33, the separated electrons are transported to a cathode that is one of the lower electrode 31 and the upper electrode 33, and the electrons and/or holes are collected in the charge storage 55c to incur photoelectric conversion effects. The third photoelectric conversion device 30c obtains a signal of light of the first color and the second color.

The semiconductor substrate 110 may be a silicon substrate, and is integrated with the photo-sensing device 50, the charge storages 55a, 55b, and 55c, and a transmission transistor (not shown).

The photo-sensing device 50 may be a photodiode. The photo-sensing device 50 senses light, and information derived from the sensed light may be transferred by the transmission transistor. The charge storage 55a is electrically connected to the first photoelectric conversion device 30a and information of the charge storage 55a may be transferred by the transmission transistor. The charge storage 55b is electrically connected to the second photoelectric conversion device 30b, and information of the charge storage 55b may be transferred by the transmission transistor. The charge storage 55c is electrically connected to the third photoelectric conversion device 30c, and information of the charge storage 55c may be transferred by the transmission transistor.

The photo-sensing device 50 may sense light transmitting through the first color filter 70a and the first photoelectric conversion device 30a, light transmitting through the second color filter 70b and the second photoelectric conversion device 30b, or light transmitting through the third color filter 70c and the third photoelectric conversion device 30c. That is, the photo-sensing device 50 may sense light of the third color.

Specifically, mixed light of the first color and the third color of a visible light including the first color, the second color, and the third color transmits through the first color filter 70a, and light of the first color is selectively absorbed by the first light-absorption region 32a, and thus the photo-sensing device 50 senses light of the third color. Similarly, mixed light of a second color and a third color of the visible light including the first color, the second color, and the third color transmits through the second color filter 70b, and light of the second color is selectively absorbed by the second light-absorption region 32b, and thus the photo-sensing device 50 senses light of the third color. Similarly, mixed light of the first color, the second color, and the third color of visible light including the first color, the second color, and the third color transmits through the third color filter 70c, and light of the first color and the second color is selectively absorbed by the third light-absorption region 32c, and thus the photo-sensing device 50 senses light of the third color.

A metal wire (not shown) and a pad (not shown) are formed on the photo-sensing device 50. Further, it is not limited to the structure, and the metal wire and pad may be positioned under the photo-sensing device 50.

An insulation layer 60 is formed between the semiconductor substrate 110 and the photoelectric conversion device 30. The insulation layer 60 has a trench 65 exposing the charge storages 55a, 55b, and 55c.

Accordingly, the image sensor according to the example embodiment has a structure where the photoelectric conversion device 30 is stacked on the semiconductor substrate 110, and thus an area of the image sensor may be reduced and a down-sized image sensor may be realized.

The image sensor according to the example embodiment may reduce light loss by a color filter and thus increase light-absorption efficiency by including a color filter configured to transmit mixed light. Furthermore, the image sensor according to the example embodiment includes a color filter transmitting the three primary colors, that is, a white color filter, and thereby reduces light loss by a color filter and increases light-absorption efficiency.

The image sensor according to the example embodiment includes a color filter transmitting the three primary colors, that is a white color filter, and thereby reduction of sensitivity and luminance of an image sensor may be substantially prevented under a low lamination condition, and high sensitivity and high luminescence characteristics may be realized.

The image sensor according to the example embodiment includes a color filter transmitting the three primary colors, that is, a white color filter, and the intensity of light transmittance depending on a wavelength in a visible ray region may be desirably controlled as a result.

In addition, the image sensor according to the example embodiment has increased wavelength selectivity of light absorbed by a photoelectric conversion device and light sensed by a photo-sensing device, and thus reduces a crosstalk.

The image sensor according to the example embodiment decreases a gap between the photoelectric conversion device and the semiconductor substrate by disposing a color filter layer at the upper side, and processability is improved and current loss is decreased as a result.

Hereinafter, an image sensor according to another example embodiment is described.

FIG. 10 is a schematic view illustrating a stacking structure of an image sensor according to another example embodiment, FIG. 11 is a cross-sectional view of the image sensor of FIG. 10, and FIG. 12 is a schematic view illustrating an arrangement of color filters of the image sensor of FIG. 10.

The image sensor 400 according to the example embodiment includes a color filter layer 70, a photoelectric conversion device 30, and a semiconductor substrate 110.

The color filter layer 70 may include a color filter configured to transmit mixed light of two colors selected from three primary colors of a first color, a second color and a third color.

The color filter layer 70 may include a color filter configured to transmit mixed light of two colors selected from three primary colors of a first color, a second color and a third color. The color filter layer 70 may include a fourth color filter 70d configured to selectively transmit mixed light of a first color and a third color, or a mixed light of a second color and a third color, and a region without a color filter. The fourth color filter 70d and the region without the color filter may be alternately arranged along a row and a column. The fourth color filter 70d may be, for example a cyan filter, a yellow filter, or a magenta filter.

The photoelectric conversion device 30 may be disposed under the color filter layer 70 and may selectively sense at least a portion of light transmitting through the color filter layer 70.

The photoelectric conversion device 30 includes a lower electrode 31 and a upper electrode 33 facing each other and a light-absorption layer 32 between the lower electrode 31 and the upper electrode 33.

The light-absorption layer 32 may selectively absorb mixed light of a first color and a second color selected from three primary colors of a first color, a second color, and a third color. That is, the light-absorption layer 32 selectively absorbs mixed light of a first color and a second color and transmits light of a third color.

The light-absorption layer 32 includes a fourth light-absorption region 32d overlapping the fourth color filter 70d, and a fifth light-absorption region 32e not overlapping the fourth color filter 70d.

Mixed light of the first color and the third color, or mixed light of the second color and the third color, transmitting through the fourth color filter 70d flows into the fourth light-absorption region 32d, light of the first color or the second color is selectively absorbed, and light of the third color is transmitted. Incident light flows into the fifth light-absorption region 32e, mixed light of the first color and the second color is selectively absorbed, and light of the third color is transmitted.

The lower electrode 31, the fourth light-absorption region 32d, and the upper electrode 33 form a fourth photoelectric conversion device 30d. Excitons may be generated from light of a first color or a second color absorbed in the fourth light-absorption region 32d, the generated excitons are separated into holes and electrons, the separated holes are transported to an anode that is one of the lower electrode 31 and the upper electrode 33, the separated electrons are transported to a cathode that is one of the lower electrode 31 and the upper electrode 33, and the electrons and/or holes are collected in the charge storage 55d to incur photoelectric conversion effects. The fourth photoelectric conversion device 30d obtains a signal of light of the first color or the second color.

The lower electrode 31, the fifth light-absorption region 32e, and the upper electrode 33 form a fifth photoelectric conversion device 30e. Excitons may be generated from mixed light of a first color and a second color absorbed in the fifth light-absorption region 32e, the generated excitons are separated into holes and electrons, the separated holes are transported to an anode that is one of the lower electrode 31 and the upper electrode 33, the separated electrons are transported to a cathode that is one of the lower electrode 31 and the upper electrode 33, and the electrons and/or holes are collected in the charge storage 55e to incur photoelectric conversion effects. The fifth photoelectric conversion device 30e obtains a signal of light of the first color and the second color. Signals of light of the second color or the first color may be obtained from a signal difference between the fourth photoelectric conversion device 30d and the fifth photoelectric conversion device 30e.

The semiconductor substrate 110 may be a silicon substrate, and is integrated with the photo-sensing device 50, the charge storages 55d and 55e and a transmission transistor (not shown).

The photo-sensing device 50 may be a photodiode. The photo-sensing device 50 senses light, and information derived from the sensed light may be transferred by the transmission transistor. The charge storage 55d is electrically connected to the fourth photoelectric conversion device 30d, and information from the charge storage 55d may be transferred by the transmission transistor. The charge storage 55e is electrically connected to the fifth photoelectric conversion device 30e, and information from the charge storage 55e may be transferred by the transmission transistor.

The photo-sensing device 50 may sense light transmitting through the fourth color filter 70d and the fourth photoelectric conversion device 30d, or light transmitting through the fifth photoelectric conversion device 30e. That is, the photo-sensing device 50 may sense light of the third color.

Specifically, mixed light of the first color and the third color, or mixed light of the second color and the third color of visible light including the first color, the second color, and the third color transmits through the fourth color filter 70d, and light of the first color or the second color is selectively absorbed by the fourth light-absorption region 32d, and thus the photo-sensing device 50 senses light of the third color. Similarly, visible light including the first color, the second color, and the third color reaches the fifth photoelectric conversion device 30e, light of the first color or the second color is selectively absorbed by the fifth light-absorption region 32e, and thus the photo-sensing device 50 senses light of the third color.

Accordingly, the image sensor according to the example embodiment has a structure where the photoelectric conversion device 30 is stacked on the semiconductor substrate 110, and thus an area of the image sensor may be reduced and a down-sized image sensor may be realized.

The image sensor according to the example embodiment may reduce light loss by a color filter and thus increase light-absorption efficiency by including a color filter configured to transmit mixed light. Furthermore, the image sensor according to the example embodiment includes a region without a color filter, and thereby reduces light loss by a color filter and increases light-absorption efficiency.

In addition, the image sensor according to the example embodiment has increased wavelength selectivity of light absorbed by a photoelectric conversion device and light sensed by a photo-sensing device, and thus reduces cross-talk.

The image sensor according to the example embodiment decreases a gap between the photoelectric conversion device and the semiconductor substrate by disposing a color filter layer at the upper side, and processability is improved and current loss is decreased as a result.

Hereinafter, an image sensor according to another example embodiment is described.

FIG. 13 is a schematic view illustrating a stacking structure of an image sensor according to another example embodiment, FIG. 14 is a cross-sectional view of the image sensor of FIG. 13, and FIG. 15 is a schematic view illustrating an arrangement of color filters of the image sensor of FIG. 13.

The image sensor 500 according to the example embodiment includes a color filter layer 70, a photoelectric conversion device 30, and a semiconductor substrate 110.

The color filter layer 70 includes an array of a plurality of unit color filters that are repeatedly arranged along a row and a column, and the color filter array may have various matrix arrangements, for example 2×2, 3×3, 4×4, and the like.

The color filter layer 70 may include a color filter configured to transmit mixed light of two colors selected from three primary colors of a first color, a second color and a third color. The color filter layer 70 may include a fourth color filter 70d configured to selectively transmit mixed light of a first color and a third color, or mixed light of a second color and a third color and a fifth color filter 70e configured to selectively transmit mixed light of the first color, the second color, and the third color. The fourth color filter 70d and the fifth color filter 70e may be alternately arranged along a row and a column. The fourth color filter 70d may be, for example a cyan filter, a yellow filter, or a magenta filter, and the fifth color filter 70e may be, for example a white color filter.

The photoelectric conversion device 30 may be disposed under the color filter layer 70 and may selectively sense at least a portion of light transmitting through the color filter layer 70.

The photoelectric conversion device 30 includes a lower electrode 31 and a upper electrode 33 facing each other, and a light-absorption layer 32 between the lower electrode 31 and the upper electrode 33.

The light-absorption layer 32 may selectively absorb mixed light of a first color and a second color selected from three primary colors of a first color, a second color, and a third color. That is, the light-absorption layer 32 selectively absorbs mixed light of a first color and a second color and transmits light of a third color.

The light-absorption layer 32 includes a fourth light-absorption region 32d overlapping the fourth color filter 70d and a fifth light-absorption region 32e overlapping the fifth color filter 70e.

Mixed light of the first color and the third color, or mixed light of the second color and the third color transmitting through the fourth color filter 70d flows into the fourth light-absorption region 32d, light of the first color or the second color is selectively absorbed and light of the third color is transmitted. Incident light flows into the fifth light-absorption region 32e, mixed light of the first color and the second color is selectively absorbed, and light of the third color is transmitted.

The lower electrode 31, the fourth light-absorption region 32d, and the upper electrode 33 form a fourth photoelectric conversion device 30d. Excitons may be generated from light of a first color or a second color absorbed in the fourth light-absorption region 32d, the generated excitons are separated into holes and electrons, the separated holes are transported to an anode that is one of the lower electrode 31 and the upper electrode 33, the separated electrons are transported to a cathode that is one of the lower electrode 31 and the upper electrode 33, and the electrons and/or holes are collected in the charge storage 55d to incur photoelectric conversion effects. The fourth photoelectric conversion device 30d obtains a signal of light of the first color or the second color.

The lower electrode 31, the fifth light-absorption region 32e, and the upper electrode 33 form a fifth photoelectric conversion device 30e. Excitons may be generated from a mixed light of a first color and a second color absorbed in the fifth light-absorption region 32e, the generated excitons are separated into holes and electrons, the separated holes are transported to an anode that is one of the lower electrode 31 and the upper electrode 33, the separated electrons are transported to a cathode that is one of the lower electrode 31 and the upper electrode 33, and the electrons and/or holes are collected in the charge storage 55e to incur photoelectric conversion effects. The fifth photoelectric conversion device 30e obtains a signal of light of the first color and the second color. Signals of light of the second color or the first color may be obtained from a signal difference between the fourth photoelectric conversion device 30d and the fifth photoelectric conversion device 30e.

The semiconductor substrate 110 may be a silicon substrate, and is integrated with the photo-sensing device 50, the charge storages 55d and 55e and a transmission transistor (not shown).

The photo-sensing device 50 may be a photodiode. The photo-sensing device 50 senses light, and information derived from the sensed light may be transferred by the transmission transistor. The charge storage 55d is electrically connected to the fourth photoelectric conversion device 30d, and information from the charge storage 55d may be transferred by the transmission transistor. The charge storage 55e is electrically connected to the fifth photoelectric conversion device 30e, and information from the charge storage 55e may be transferred by the transmission transistor.

The photo-sensing device 50 may sense light transmitting through the fourth color filter 70d and the fourth photoelectric conversion device 30d, or light transmitting through the fifth photoelectric conversion device 30e. That is, the photo-sensing device 50 may sense light of the third color.

Specifically, mixed light of a first color and a third color, or mixed light of a second color and a third color of visible light including the first color, the second color, and the third color transmits through the fourth color filter 70d, and light of the first color or the second color is selectively absorbed by the fourth light-absorption region 32d, and thus the photo-sensing device 50 senses light of the third color. Similarly, visible light including the first color, the second color, and the third color reaches the fifth photoelectric conversion device 30e, light of the first color or the second color is selectively absorbed by the fifth light-absorption region 32e, and thus the photo-sensing device 50 senses light of the third color.

While this disclosure has been described in connection with what is presently considered to be practical example embodiments, it is to be understood that the invention is not limited to the disclosed example embodiments, but, on the contrary, is intended to cover various modifications and equivalent arrangements included within the spirit and scope of the appended claims.

What is claimed is:

1. An image sensor comprising:
   a semiconductor substrate including a plurality of photo-sensing devices, a plurality of photoelectric conversion devices on the semiconductor substrate, the plurality of photoelectric conversion devices comprising a first photoelectric conversion device configured to absorb light of a first color or a second color, and a color filter layer including at least a color filter, the color filter layer overlapping the plurality of photoelectric conversion devices and configured to transmit at least a third color, the color filter layer being closer to an incident of light than the plurality of photoelectric conversion devices, wherein the color filter comprises a first color filter overlapping the first photoelectric conversion device configured to selectively transmit a combination of the first color and the third color, or a second color filter overlapping the first photoelectric conversion device configured to selectively transmit a combination of the second color and the third color, and the first color, the second color and the third color being different from one another, wherein the color filter layer further comprises a third color filter configured to transmit a combination of the first color, the second color, and the third color, the first color filter or the second color filter and the third color filter are alternately located along at least one of at least one row and at least one column, and wherein the plurality of photoelectric conversion devices further comprises a second photoelectric conversion device overlapping the third color filter and configured to convert the combination of the first color and the second color.

2. The image sensor of claim 1, wherein the plurality of photo-sensing devices are configured to sense the third color.

3. The image sensor of claim 1, wherein:
the first color includes blue,
the second color includes red, and
the third color includes green.

4. The image sensor of claim 1, wherein each of the photoelectric conversion devices of the plurality of photoelectric conversion devices comprises:
a pair of electrodes facing each other, and
a light-absorption layer between the pair of electrodes and including a light-absorbing material configured to selectively absorb the first color, a light-absorbing material configured to selectively absorb the second color, or a light-absorbing material configured to selectively absorb the first color and the second color.

5. An electronic device including the image sensor of claim 1.

6. An image sensor comprising:
a color filter layer including color filters configured to transmit light, a plurality of photoelectric conversion devices overlapping the color filter layer including the color filters and configured to absorb at least a portion of the light transmitting through the color filter layer including the color filters, the at least a portion of the light including light of a first color or a second color, and a plurality of photo-sensing devices overlapping the plurality of photoelectric conversion devices and configured to sense light of a third color, the light of the third color being light transmitting through the plurality of photoelectric conversion devices, wherein the first color, the second color and the third color being different from one another, wherein the color filters include:
a first color filter configured to selectively transmit a combination of the first color and the third color, or
a second color filter configured to selectively transmit a combination of the second color and the third color;

wherein the plurality of photoelectric conversion devices includes,
a first photoelectric conversion device overlapping the first color filter or the second color filter and configured to selectively absorb light of the first color or the second color; and
a second photoelectric conversion device not overlapping the first color filter or the second color filter and configured to selectively absorb the combination of the first color and the second color.

7. The image sensor of claim 6, wherein the color filter layer including the color filters further comprises:
a third color filter configured to transmit a combination of the first color, the second color, and the third color, the third color filter overlapping the second photoelectric conversion device.

8. The image sensor of claim 6, wherein:
the first color includes blue,
the second color includes red, and
the third color includes green.

9. The image sensor of claim 6, wherein the plurality of photoelectric conversion devices comprises:
a pair of electrodes facing each other, and
a light-absorption layer between the pair of electrodes and including a light-absorbing material configured to selectively absorb the first color, a light-absorbing material configured to selectively absorb the second color, or a light-absorbing material configured to selectively absorb the first color and the second color.

10. An electronic device including the image sensor of claim 6.

* * * * *